United States Patent [19]

Lai

[11] 4,414,313
[45] Nov. 8, 1983

[54] SENSITIVE POSITIVE ELECTRON BEAM RESISTS

[75] Inventor: Juey H. Lai, Burnsville, Minn.

[73] Assignee: Honeywell Inc., Minneapolis, Minn.

[21] Appl. No.: 363,334

[22] Filed: Mar. 29, 1982

[51] Int. Cl.$^3$ ............................................. B05D 3/06
[52] U.S. Cl. ................................... 430/295; 427/43.1;
427/44; 427/273; 430/286; 430/296; 430/320
[58] Field of Search ....................... 427/43.1, 44, 273;
430/286, 326, 296, 295

[56] References Cited

U.S. PATENT DOCUMENTS 4,276,365 6/1981 Yoneda et al. ..................... 427/43.1

Primary Examiner—Norman Morgenstern
Assistant Examiner—Janyce A. Bell
Attorney, Agent, or Firm—Charles G. Mersereau

[57] ABSTRACT

A process for making highly sensitive positive electron beam resists comprised of copolymers of methacrylic acid (MAA) and methyl α-chloroacrylate (MCA) is disclosed in which a thin film of high molecular weight MAA/MCA copolymer is applied to a suitable substrate. Prior to exposure, the copolymer is prebaked at a temperature below the decomposition temperature to improve the sensitivity and resolution of the resist. The exposed resist is developed by spraying with a suitable solvent. The positive electron resists produced in accordance with the present invention exhibit a high sensitivity and good submicron resolution.

11 Claims, No Drawings

SENSITIVE POSITIVE ELECTRON BEAM RESISTS

The invention herein described was made in the course of or under a contract or subcontract thereunder with the Department of the Army.

BACKGROUND OF THE INVENTION

1. Field of the Invention

The present invention relates generally to the field of radiation sensitive resist films used in microcircuit fabrication and, more particularly, to the fabrication of positive electron beam sensitive resist films comprised of copolymers of methacrylic acid and methyl-α-chloroacrylate having high sensitivity and submicron resolution.

2. Description of the Prior Art

The application of electron beam techniques to semiconductor fabrication has enabled great strides to be made in reducing the minimum line width and thus the size of an integrated circuit pattern which can successfully be manufactured. This has been accomplished both through progress in the technology involved including improvement in the precision of the electron beam system itself and in the progress which has been made in the technology concerned with the pattern defining medium or resist material.

In electron beam microfabrication, a substrate, which may be, for example, silicon dioxide, silicon, glass or chromium plated glass, is coated with a layer of polymer resist material. The resist is patterned by changing the solubility of the polymer with an electron beam. Subsequently, the resist film is "developed" by dissolving away the unwanted area of polymer utilizing a suitable solvent material and the resultant pattern is used as a mask for plating, chemical etching, ion etching or ion implantation. This electron beam lithography (EBL) is an integrated circuit production technique which utilizes a polymer resist to delineate circuit patterns for monolithic circuits.

When polymer resist coating materials of the required type are irradiated with an electron beam, the molecular structure is affected such that some of the polymer molecules are excited or ionized by the beam. This excitation causes some of the resist molecules to cross-link with other molecules in the polymer and others to degrade or undergo scission. The predominant manner in which such a polymeric material reacts to exposure to an electron beam has led electron resists to be classified into two main categories. A polymer which becomes predominantly gelled or cross-linked, and thereby decreases its solubility after irradiation, is termed a negative resist. Conversely, if the scission process predominates and the solubility of the polymer increases after irradiation, it is called a positive resist. The resists of the present invention are positive resists.

A suitable electron resist material must have certain characteristic physical and chemical properties which allow it to fulfill the requirements for electron beam fabrication. The polymer material involved must be sensitive to an electron current of a fairly low value or the resist sensitivity itself will be the limiting factor on the writing speed and line width which can be achieved. The resist medium must be capable of achieving a high resolution or resist contrast compatible with that of writing and etching techniques utilizing the high resolution capability available with electron beam technology. In addition, the resist must have the ability to adhere satisfactorily to a variety of substrates used in different microfabrication applications. The medium also must be able to withstand normal acid, base, and ion etching processes and should not be sensitive to small daily process variabilities.

Positive type electron resist films of comonomers of methylmethacrylate (MMA) with such monomers as acrylonitrile (AN), methacrylonitrile (MCN) and maleic anhydride are known in the prior art. Such combinations are shown in U.S. Pat. No. 3,914,462 to Morishita et al. Similar copolymer materials are disclosed in a patent to Gipstein et al U.S. Pat. No. 4,011,351, which discloses a method of producing a positive resist image from copolymers of alkyl methacrylate units and polymerized units of certain other ethylenically unsaturated monomers. Those copolymers include alkyl methacrylate units wherein the alkyl group contains from one to four carbon atoms copolymerized with ethylenically unsaturated monomers which may contain any of numerous substituted groups or multipally substituted groups. Certain other polymerized alkyl methacrylate copolymers including polymerized monoethylenically unsaturated acid units have also been proposed in Feder et al, U.S. Pat. No. 3,984,582.

The prior art such as the Feder et al patent, cited above, also discloses the use of a prebaking fabrication step in which the prepared polymeric resist, having been coated upon a substrate by spin coating or dipping and dried to remove volatile material, is prebaked. The prebaking temperature is above the glass transition temperature of the polymeric material, but below the decomposition temperature of the material to remove any remaining solvent. The prebaking step changes the solubility of the copolymer and improves adhesion to the substrate.

The change in solubility of copolymer resists such as MMA/MAA (methacrylic acid) has been found to be highly dependent on the prebaking temperature and time and is very hard to control. Therefore, the temperature and time control in the prebake step must be extremely accurate in order to maintain repeatability of resist sensitivity and resolution in the development of such resists.

Thus, it can be seen from the prior art that numerous polymers including copolymers of MAA and substituted MAA esters copolymerized with various ethylenically unsaturated monomers have been proposed. In addition, prebaking steps have been utilized in the preparation of resist films utilizing such copolymer combinations such as MMA/MAA with varying degrees of success.

SUMMARY OF THE INVENTION

According to the present invention, it has been discovered that positive electron beam resists having unexpected sensitivity and resolution can be produced using copolymers of methacrylic acid (MAA) and methyl α-chloroacrylate (MCA) in a range of percentage composition ratios. The positive electron resists produced in accordance with the present invention exhibit a high sensitivity, and very good submicron resolution.

In the preferred fabrication process, a copolymer of methacrylic acid (MAA) and methyl α-chloroacrylate (MCA) is prepared by solution polymerization using a free radical initiator in a manner which produces a high molecular weight copolymer wherein the $M_w$ (weight average molecular weight) of the polymer may be as high as 500,000. The poly (MAA-co-MCA) produced is dissolved in a suitable solvent such as methyl cellosolve (2-methoxy ethanol) and coated on a suitable substrate such as SiO$_2$. The coated substrate is then prebaked at an elevated temperature below its decomposition temperature. The actual temperature and the time involved depend on the relative composition of the copolymer and the subsequent resist properties desired. The resist film is then exposed to a predetermined pattern of radiation by an electron beam or other source and developed. Development is preferably done by spraying with a suitable developing solvent such as methyl cellosolve which removes the exposed area. Solvent selection depends on the particular copolymer composition, prebake temperature and other considerations. The resist film may then be post-baked at a temperature suitable for removing the remaining developing solvent.

DESCRIPTION OF THE PREFERRED EMBODIMENT

High molecular weight MAA/MCA copolymers of widely differing MAA/MCA ratios have been found to possess excellent positive electron resist behavior. While success in achieving this observed behavior depends to a great extent on properly matching process steps and variables associated with the process steps to the particular polymer composition and molecular weight involved, certain common criteria are important. These include using MAA/MCA copolymers of high average molecular weight, prebaking the resist at a proper temperature after coating on the substrate but before electron beam exposure, and using the proper developing technique. In accordance with the following examples, highly sensitive positive electron resists capable of submicron resolution are produced.

POLYMER PREPARATION

The MAA/MCA copolymers were generally prepared by free-radical polymerization in solution. Because the electron resist sensitivity increases with increasing polymer molecular weight, the polymerization conditions were adjusted so that high molecular weight polymers were obtained. The preferred $\bar{M}_w$ (weight average molecular weight) of the polymers is from about 125,000 to over 500,000 depending on the mole percentage composition of the copolymer which preferably contains from about 30 to 80 mole percent of MAA and from about 70 to 20 mole percent of MCA.

EXAMPLE 1

A solution was prepared by dissolving 15 ml of vacuum-distilled (6 mm H$_g$) methacrylic acid (MAA) and 15 ml of vacuum distilled methyl α-chloroacrylate (MCA) in 180 ml of chlorobenzene. The MAA monomer was obtained from Eastman Kodak, Rochester, N.Y., and the MCA monomer was obtained from Polysciences, Inc. of Warrington, Pennsylvania. The solution was placed in a 250 ml, 3-neck, round-bottom flask equipped with a stirring mechanism, reflux condenser and nitrogen gas inlet. The mixture of monomer and solvent was then heated to 60° C. in the presence of flowing N$_2$ gas. A free-radical initiator consisting of 40 mg of 2,2-azo-bis-iso-butyronitrile (AIEN) was then added as a free radical initiator for the polymerization. The polymerization was carried out at 60° C. for 5 hours. Since the MAA/MCA copolymer does not dissolve in chlorobenzene, it continuously precipitates out as it is formed. Thus, the polymerization is, in fact, a "precipitation polymerization". The polymer was then separated from the mixture by washing twice with petroleum ether and then filtered. The copolymer was dried at 45° C. for 24 hours at about 10$^{-2}$ Torr. The yield of the polymer was about 36.1 gm. Elemental analysis of the copolymer indicated that it contained 39.1 mole percent of MCA and 61.9 mole percent of MAA.

EXAMPLES 2-6

The polymerization process steps for Examples 2-6 were the same as that of Example 1. The ingredients and polymerization conditions for all six Examples are found in Table I.

TABLE I

| MAA/MCA Copolymer | Monomer ml | | AIBN mg | Chlorobenzene ml | Polymerization temp. °C. | Polymerization time hours |
| --- | --- | --- | --- | --- | --- | --- |
| | MCA | MAA | | | | |
| Copolymer-1 | 15 | 15 | 40 | 180 | 60 | 5 |
| Copolymer-2 | 10 | 20 | 40 | 180 | 60 | 2 |
| Copolymer-3 | 15.6 | 7.8 | 31 | 180 | 60 | 2.5 |
| Copolymer-4 | 8 | 22 | 40 | 180 | 60 | 2 |
| Copolymer-5 | 17 | 13 | 40 | 180 | 60 | 2 |
| Copolymer-6 | 6 | 24 | 40 | 180 | 60 | 2 |

In Table II, the observed characteristics of the six copolymers synthesized in accordance with Examples 1-6 are listed. The copolymers are listed in the order of decreasing MCA content. It has been found that solubility of MCA/MAA copolymers is significantly dependent on their composition. Thus, the intrinsic viscosity of the copolymers was determined in two different solvents. The molecular weight distribution ($\bar{M}_w/\bar{M}_n$) of MCA/MAA copolymers 1-5 was calculated from GPC (gel permeation chromatography) chromatograms and is also listed in Table II. The composition of MCA/MAA copolymer resists was determined by chlorine analysis performed by Galbraith Laboratory in Knoxville, Tenn.

TABLE II

| MCA/MAA Copolymer | Composition mole % | | Gel Permeation Chromatography Data | | | Intrinsic Viscosity $[\eta]_{25°}$ |
| --- | --- | --- | --- | --- | --- | --- |
| | MCA | MAA | $\bar{M}_w$ | $\bar{M}_n$ | $\bar{M}_w/\bar{M}_n$ | |
| Copolymer-3 | 66.7 | 33.3 | 145,000 | 86,000 | 1.7 | 1.52 in THF |
| Copolymer-5 | 57.7 | 42.3 | 131,000 | 65,000 | 2.0 | 1.80 in THF |
| Copolymer-1 | 39.1 | 61.9 | 289,000 | 168,000 | 1.7 | 1.27 in THF |
| Copolymer-2 | 31.3 | 68.7 | 329,000 | 110,000 | 3.0 | 1.37 in methanol |
| Copolymer-4 | 28.0 | 72.0 | 509,000 | 193,000 | 2.6 | 2.07 in methanol |

TABLE II-continued

| MCA/MAA Copolymer | Composition mole % | | Gel Permeation Chromatography Data | | | Intrinsic Viscosity |
|---|---|---|---|---|---|---|
| | MCA | MAA | $\overline{M}_w$ | $\overline{M}_n$ | $\overline{M}_w/\overline{M}_n$ | $[\eta]_{25°}$ |
| Copolymer-6 | 18.3 | 81.7 | — | — | — | — |

RESIST PREPARATION

Solutions of the polymers 1–5 in methyl cellosolve (MCV) were prepared and spin coated on $SiO_2$ substrates in accordance with the parameters listed in Table III.

TABLE III

| Copolymer | Spinning Solution | Film Thickness μm | | |
|---|---|---|---|---|
| | | 1K | 2K | 3K rpm |
| Copolymer-1 | 7 wt./v. % MCV | 1.31 | 0.98 | 0.83 |
| Copolymer-2 | 7 wt./v. % MCV | 1.34 | 0.95 | 0.81 |
| Copolymer-3 | 6 wt./v. % MCV | 1.19 | 0.82 | 0.65 |
| Copolymer-4 | 6 wt./v. % MCV | 1.46 | 1.04 | 0.87 |
| Copolymer-5 | 6 wt./v. % MCV | 0.98 | | |

In accordance with the invention, prior to exposure of the resist coated substrate to the electron beam, the coated substrate is prebaked at an elevated temperature normally above its glass transition temperature, i.e., about 150 degrees C., but below its decomposition temperature for a time from about 20 minutes to about 2 hours. With the exception of copolymers 4 and 5, the resist films were prebaked at 160° C. for 30 minutes. The MAA/MCA copolymers containing 25 to 30 mole percent MCA, such as copolymer-4, which has an approximate composition of 2.6:1 MAA/MCA, were observed to produce the best results using a prebake temperature of approximately 200° C. for 30 minutes. Also, copolymers containing 55 to 60 mole percent MCA such as copolymer-5, which has an approximate composition of 1:1.3 MAA/MCA, were found to be in the range from 160° C. up to 180° C.

After the prebaking step, to determine the sensitivity in the resolution of the resists, the resists were exposed to an electron beam in a Honeywell micropattern generator with two test patterns that cover a wide range of exposure. The sensitivity test pattern contained 50 lines 1 μm wide × 1.5 mm long. The spacing between each line was 6 μm and the exposure ranged from 0.5 to 450 μC cm$^{-2}$. The resolution test pattern contained 20 sets of 100 μm long lines. Each set contained six lines of equal exposure and the spacing between lines was 1 μm. The line charge density varied from $1 \times 10^{-12}$ to $1 \times 10^{-9}$ Culombs cm$^{-1}$.

The resists were then developed utilizing wet solvent development techniques. It was discovered that the development technique used must be tailored to the specific copolymer composition-prebake temperature combination as both the polymer composition, i.e., the ratio of the monomers in the polymerized structure, and the prebake temperature significantly affect the final sensitivity of the electron resist.

In accordance with the observed characteristics of the MAA/MCA copolymer resists generally and especially those predominately MCA copolymer resists made in accordance with the invention, a prebake temperature of approximately 160° C. for a duration of about 30 minutes appears to give the best results. For predominantly MAA copolymers, however, the optimum prebaked temperature has been found to be somewhat higher. Thus for the 2.6:1 MAA/MCA copolymer-4, a prebake at 200° C. gives superior results.

The resists produced satisfactory results in all tested polymer percentage compositions. However, it should be noted that of the various copolymer percentage compositions illustrated by the copolymers 1–6, the best electron resist properties were exhibited by copolymers 4 and 5. These compositions yielded resists of superior sensitivity and resolution.

As stated above, after exposure to the electron beam, the resists were developed utilizing wet solvent spray development technique. Various developing solvents and combinations of developing solvents were utilized to develop the exposed resists. These include toluene, dimethylacetamide (DMA), methyl cellosolve (MCV), isopropanol (IPA), cellosolve acetate (CA) methyl ethyl ketone (MEK) and ethanol (EtOH) which were used alone or in combination. To be considered successful, developing must be accomplished with a minimum loss of thickness in the unexposed resist areas. A loss of 20% or less is considered acceptable in most cases. In all cases the prebaking step was observed to decrease polymer loss during the developing step.

In accordance with the present invention for the MAA/MCA polymer-4, prebaked 200° C., the preferred developing solvent has been found to be methyl cellosolve (MCV). The normal spray time was approximately 30 seconds and this is followed by rinsing in isopropanol for approximately 20 seconds. The sensitivity of the resist was observed to be high enough to be successful at an exposure of 10 μCcm$^{-2}$ with less than a 20% thickness loss in development. This represents a sensitivity decidedly higher than the standard poly methyl methacrylate (PMMA) which it exceeded by at least a factor of 6. The resist has also been observed to possess excellent line profiles with vertical wall and minimum swelling and undercutting.

It is believed that the high sensitivity of the MAA/MCA copolymer-4 film baked at 200° C. can be attributed at least partly to anhydride structure formation during the baking step. Because the anhydride structure in the copolymer could be moisture sensitive and hydrolyzed to methacrylic acid, to insure high performance of the MAA/MCA copolymer-4 resist, the exposure of the resist film to moisture after prebake but prior to electron beam exposure an image development should be minimized.

The other observed superior electron beam resist copolymer-5, prebaked in the range of 160° C., appears to exhibit the best positive electron resist behavior when developed by spraying with a solution of dimethylacetamide (DMA)/methyl cellosolve (MCV) in a 1:1 volume ratio for 30 seconds. This is followed by rinsing with IPA for approximately 20 seconds. The sensitivity of the resist utilizing MMA/MCA copolymer-5 has been observed to be 13 μCcm$^{-2}$ with less than a 20% unexposed resist thickness loss due to developer solvent. The resist film MAA/MCA copolymer-5 which was prebaked at 180° C. achieves its best electron beam resist behavior when developed with a combined solvent solution of DMA/IPA mixed in a volume ratio of 2:1 and sprayed on for 60 seconds. The observed sensitivity with this combination has been 13 $\mu Ccm^{-2}$ with less than 20 percent unexposed thickness loss. This resist, thus, has a sensitivity of about 5 times that of PMMA.

In addition to the observed unusually high sensitivity especially with regard to copolymers 4 and 5, the resolution of the resists of these polymers has been observed to be at least $\leq 0.5$ microns. The line quality has also been excellent. The best observed sensitivity of copolymers 1-3 has been from approximately 15 $\mu Ccm^{-2}$ to 20 $\mu Ccm^{-2}$ with a line resolution of about 0.6 microns. This, of course, is also 3-4 times more sensitive than PMMA.

The embodiments of the invention in which an exclusive property or right is claimed are defined as follows:

1. A method of producing a sensitive positive electron resist image comprising the steps of
    coating a substrate with a solution of a radiation sensitive polymeric material comprising a copolymer of methacrylic acid (MAA) and methyl α-chloroacrylate (MCA), wherein said copolymer contains from about 30 to 80 mole percent of MAA and from about 70 to 20 mole percent MCA, and wherein the weight average molecular weight of said polymeric material is equal to or greater than 125,000 to form a thin polymeric film of said polymeric material thereon;
    prebaking the coated substrate at a temperature below the decomposition temperature of said polymer material;
    exposing said polymeric film to electron-beam radiation in a predetermined pattern;
    developing said polymeric film.

2. The method according to claim 1 wherein said prebaking temperature is between 150° C. and the decomposition temperature of said polymer.

3. The method according to either of claims 1 or 2, wherein said prebaking step is carried out at said prebaking temperature from about 20 minutes to about 2 hours.

4. The method according to claim 1 wherein said copolymer contains from 25 to 30 mole percent of MCA and wherein said prebaking temperature is approximately 200° C.

5. The method according to claim 4 wherein said prebaking step is carried out at said prebaking temperature for from about 20 minutes to 2 hours.

6. The method according to claim 4 wherein said development step further comprises the sub-steps of spraying the exposed resist film for a predetermined time with a solvent consisting essentially of methyl cellosolve and rinsing to remove the solvent.

7. The method according to either of claims 1 or 2 wherein said developing step further comprises spraying said exposed polymeric film and said substrate with a liquid solvent for said resist for a period of from about 10 seconds to 30 seconds.

8. The method according to claim 7 wherein said solvent is one selected from the group consisting of methyl cellosolve, dimethylacetamide, isopropanol, toluene, cellosolve acetate, methyl ethyl ketone and ethanol or combinations thereof.

9. The method according to claim 1 wherein said polymer contains from 55 to 60 mole percent of MCA and wherein said prebake temperature is from approximately 160° C. to 180° C.

10. The method according to claim 9 wherein said prebaking step is carried out at said prebaking temperature for about 30 minutes.

11. The method according to claim 9 wherein said development step further comprises spraying the exposed resist film for a predetermined time with a solvent selected from the group consisting of a mixture of dimethylacetamide and isopropanol, a mixture of dimethylacetamide and toluene, or a mixture of dimethylacetamide and methyl cellosolve.

* * * * *